United States Patent [19]

Suwada et al.

[11] Patent Number: 5,146,188
[45] Date of Patent: Sep. 8, 1992

[54] CONSTANT CURRENT CIRCUIT AND AN OSCILLATING CIRCUIT CONTROLLED BY THE SAME

[75] Inventors: Makoto Suwada; Shuichi Inoue; Yuzo Usui, all of Kawasaki, Japan

[73] Assignee: Fujitsu Limited, Kawasaki, Japan

[21] Appl. No.: 765,272

[22] Filed: Sep. 25, 1991

[30] Foreign Application Priority Data

Sep. 26, 1990 [JP] Japan .................................. 2-256294

[51] Int. Cl.⁵ .......................... G05F 3/16; H03K 3/282
[52] U.S. Cl. .................................. 331/111; 307/296.6; 323/315; 330/257; 331/177 R
[58] Field of Search .................... 331/111, 143, 177 R; 323/312–316; 307/296.1, 296.6; 330/252, 253, 257, 261

[56] References Cited

U.S. PATENT DOCUMENTS

| 4,471,326 | 9/1984 | Steckler et al. | 331/111 |
| 4,584,535 | 4/1986 | Seevinck | 323/316 |
| 4,785,262 | 11/1988 | Ryu et al. | 331/111 |

*Primary Examiner*—Siegfried H. Grimm
*Attorney, Agent, or Firm*—Nikaido, Marmelstein, Murray & Oram

[57] ABSTRACT

A constant current circuit having an output current $I_2$ which changes with the change of the power source voltage $V_{cc}$, and an oscillating circuit whose oscillation frequency is made variable by the change of $I_2$ in the constant current circuit. The constant current circuit comprises bipolar transistors coupled to form a differential amplifier, wherein one of the transistors is supplied with a reference voltage and another is supplied with a divided voltage of $V_{cc}$, and a resistor connecting the emitters of the transistors is provided for controlling the slope of the $V_{cc}$-$I_2$ characteristic curve of the constant current circuit. The oscillating circuit comprises a capacitor charged with $I_2$ and a switching circuit for discharging the capacitor when it is closed and a voltage detecting circuit operating to close or open the switching circuit according to the detection of the voltage at an end of the capacitor. Thus, the switching circuit operates on and off to generate pulses with frequency depending on $I_2$, hence, depending on $V_{cc}$. Methods for controlling the frequency range of the oscillating circuit and the rise time to fall time ratio of the pulses by introducing additional constant current supplying sources are also disclosed.

5 Claims, 12 Drawing Sheets

CONSTANT CURRENT CIRCUIT AND AN OSCILLATING CIRCUIT CONTROLLED BY THE SAME

BACKGROUND OF THE INVENTION

The present invention relates to a constant current circuit and an oscillating circuit controlled by the constant current circuit, the oscillating circuit capable of being used as a variable-frequency clock generator in a battery-powered computer.

Various methods for saving electric power are implemented in a computer which is powered by a battery. For example, operating voltage thereof is set lower in such operation modes not requiring high speed as the mode selection prior to the arithmetic processing, together with lowering the frequency of clock signal. Lower operating voltage and lower clock signal frequency both result in the reduction of power consumption.

In conventional battery-powered computers, one of the following techniques is applied thereto for changing clock signal frequency as described above: the first is implementing plural oscillators for generating clock signals of different frequencies, and selecting respective one of the oscillators, when performing, for example, a high speed operation such as arithmetic processing or a low speed operation such as mode selection; the second is providing a single oscillator of a relatively high frequency, and obtaining a desired low frequency by demultiplying the high frequency. However, these techniques include drawbacks of increase in the hardware such as oscillators and selecting circuits, and, of increase in the cost of the computers. Another drawback included in the above conventional technique is such that the lower frequency can not be changed continuously.

SUMMARY OF THE INVENTION

It is therefore an object of the present invention to provide an oscillating circuit capable of generating clock signals of higher frequency for operations such as arithmetic processing and of lower frequency for operations such as mode selection, within a simple circuit configuration and at low cost.

Another object of the present invention is providing an oscillating circuit which generates the higher frequency and the lower frequency clock signals, in response to the power source voltage change for the power saving.

Further an object of the present invention is providing an oscillating circuit whose oscillation frequency can continuously be changed by changing the voltage of a power supplying source.

These and other objects, features and advantages of the present invention will become clear when reference is made to the following description of the preferred embodiments of the present invention together with reference to the accompanying drawings.

DESCRIPTION OF THE PREFERRED EMBODIMENTS

Figure 1:
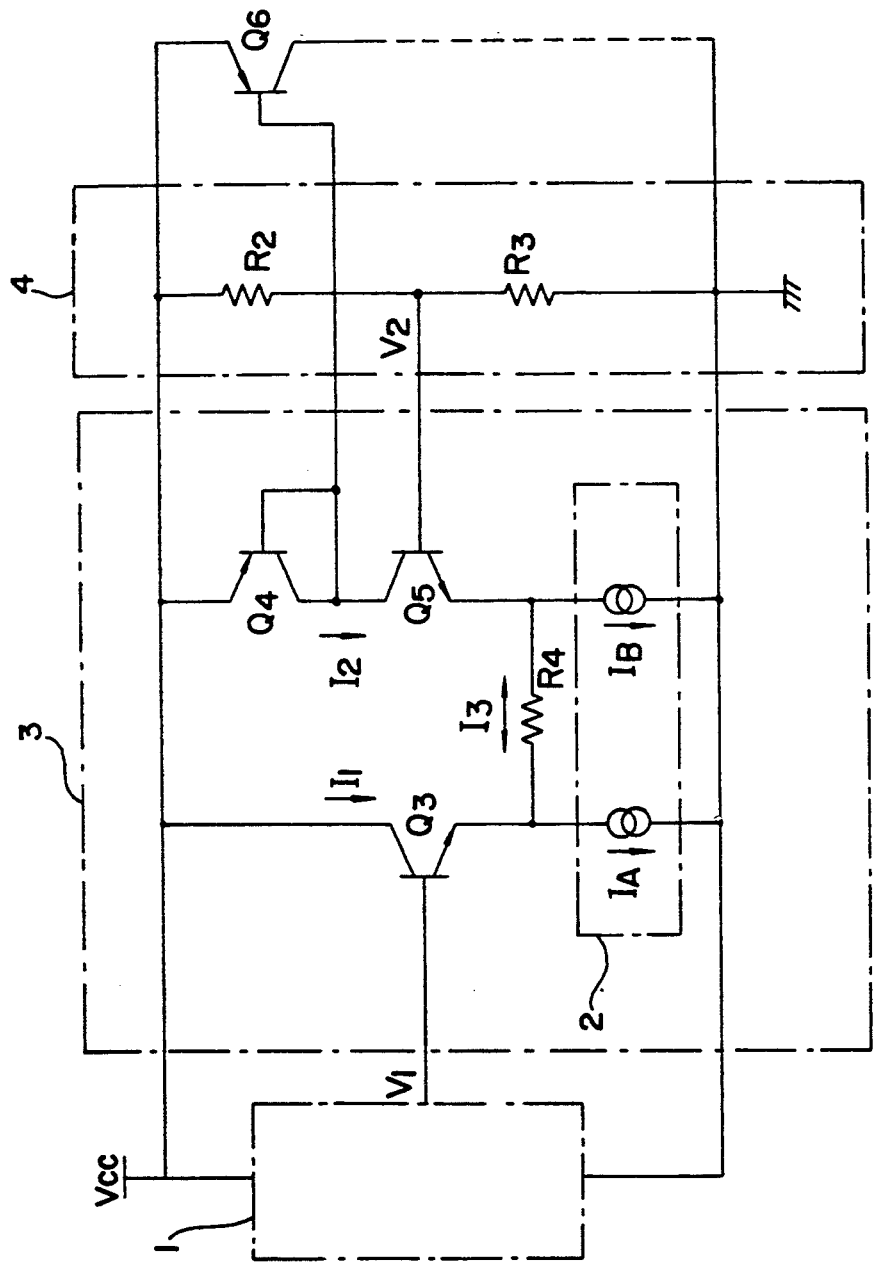
FIG. 1 is a diagram showing the fundamental configuration of a constant current circuit according to the present invention.

A constant current circuit of the present invention is as shown in the circuit diagram of FIG. 1, which comprises a reference voltage source block 1, a differential amplifier block 3 including a constant current supplying source block 2 and a resistor $R_4$, and a voltage dividing block 4 for dividing power source voltage $V_{cc}$.

Differential amplifier block 3 comprises transistors $Q_3$ and $Q_5$, bipolar transistors, for example, each having a collector connected to the power source voltage $V_{cc}$ and an emitter connected to one of the constant current supplying source $I_A$ and $I_B$. The base of the transistor $Q_3$ is supplied with a reference voltage $V_1$ from the reference voltage source block 1 and the base of transistor $Q_5$ is supplied with a divided voltage $V_2$ of power source voltage $V_{cc}$ from the node of resistors $R_2$ and $R_3$ constituting aforementioned voltage dividing block 4. The resistor $R_4$ is connected between the emitters of the transistor $Q_3$ and $Q_5$. Hence, a current $I_2$ relative to the difference between the voltages $V_1$ and $V_2$ flows through the collector of transistor $Q_5$. The transistor $Q_4$ provided between the power voltage source $V_{cc}$ and the collector of transistor $Q_5$ constitutes a current mirror in cooperation with the transistor $Q_6$. The transistors $Q_4$ and $Q_6$ are bipolar transistors, for example, each having an emitter connected to the power voltage source $V_{cc}$ and a base connected each other. The base of the transistor $Q_4$ is connected to the collector of itself.

Characteristics and operation of the constant current circuit shown in FIG. 1 are described later.

Figure 2:
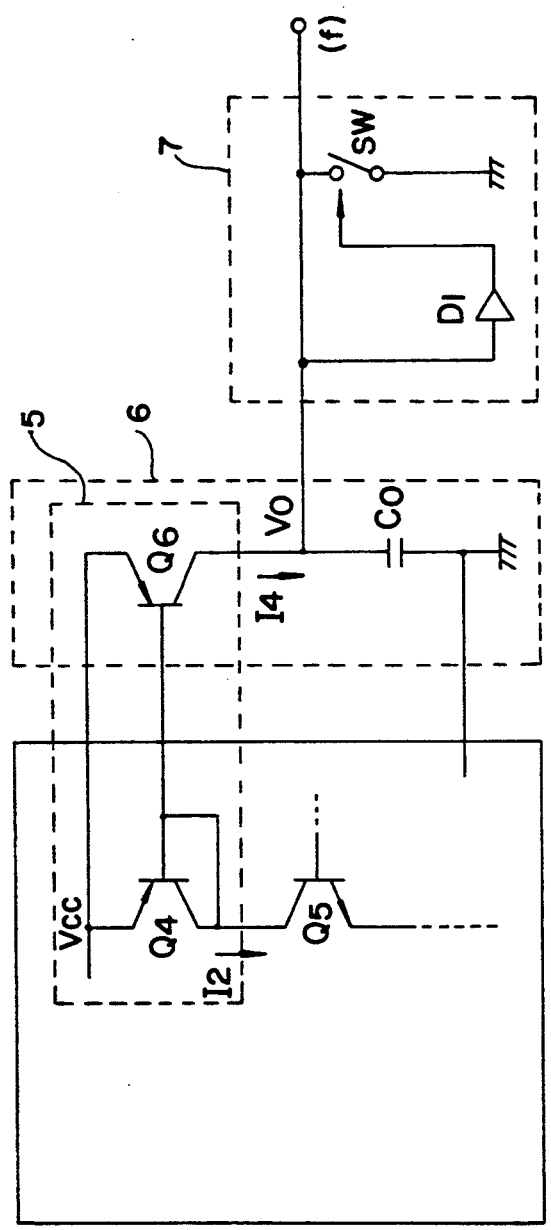
FIG. 2 is a diagram showing the fundamental configuration of an oscillating circuit according to the present invention.

The fundamental configuration of an oscillating circuit of the present invention is as shown in FIG. 2, which comprises a current integration block 6 and a charge-discharge control block 7. The current integration block 6 includes aforementioned transistor $Q_6$ constituting a current mirror 5, and a capacitor $C_0$ connected between the collector of the transistor $Q_6$ and ground potential source. The capacitor $C_0$ is charged with a current $I_4$ which is substantially equal to the current $I_2$ flowing through the transistor $Q_4$, and the potential $V_0$ at a terminal of the capacitor $C_0$ increases with the charging. The charge-discharge control block 7 includes a voltage detection circuit $D_1$ and a switch means SW. The voltage detection circuit $D_1$ detects the voltage $V_0$ of the capacitor $C_0$ and instructs the switch means SW to close when detecting $V_0$ higher than a first predetermined voltage ($V_{S1}$) and to open when detecting $V_0$ lower than a second predetermined voltage ($V_{S2}$). Hence, the capacitor $C_0$ is subject to be charged or discharged along with the ON-OFF operation of the switch means SW, and $V_0$ changes as a triangular wave of a constant frequency. The frequency can be varied by changing the power source voltage $V_{CC}$ as described later.

Figure 3:
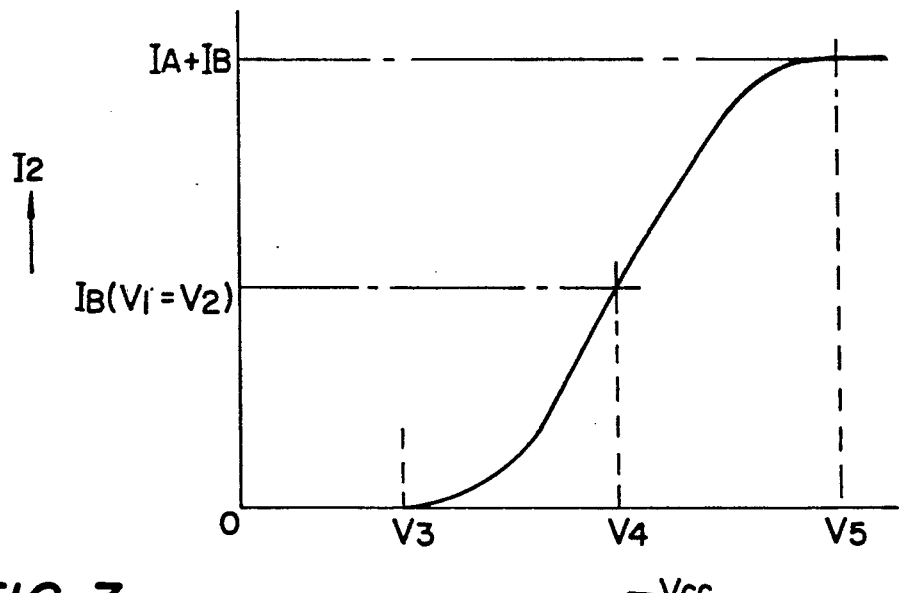
FIG. 3 is a graph showing the relation between power voltage $V_{cc}$ and current $I_2$ in the constant current circuit of FIG. 1.
Figure 4:
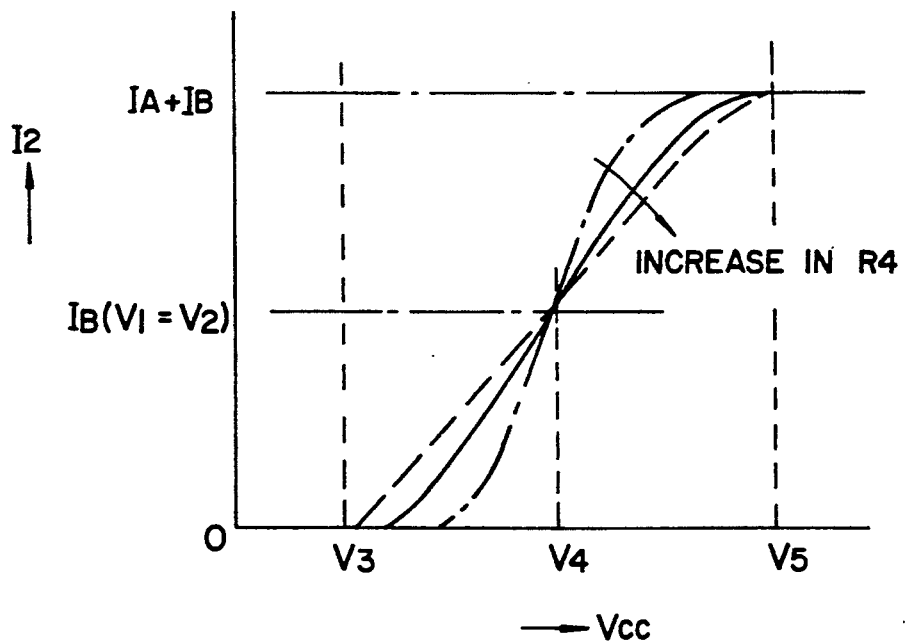
FIG. 4 is a graph for explaining the change of the slope of $V_{cc}-I_2$ characteristic curve of FIG. 3 with the change of $R_4$.

Referring again FIG. 1 together with FIG. 3, the resistor $R_2$ and $R_3$ are selected so that $V_2$ is equal to $V_1$ when the power source voltage $V_{CC}$ is $V_4$, hence $I_2=I_B$ and the current $I_3$ flowing through the resistor $R_4$ is zero. Under this condition, if the power source voltage $V_{CC}$ is increased higher than $V_4$, $V_2$ becomes larger than $V_1$, hence, the current $I_2$ increases while the current $I_1$ decreases. Accordingly, the current $I_3$ flows through the resistor $R_4$ from the transistor $Q_5$ to the constant current supplying source $I_A$. At a higher power source voltage $V_5$, the current $I_1$ flowing through the transistor $Q_3$ becomes almost zero, hence, $I_2=I_A+I_B$. If the power source voltage $V_{CC}$ is decreased lower than $V_4$, $V_2$ becomes smaller than $V_1$, hence, the current $I_1$ increases while the current $I_2$ decreases. Accordingly, the current $I_3$ flows through the resistor $R_4$ from the transistor $Q_3$ to the constant current supplying source $I_B$. At a lower power source voltage $V_3$, the current $I_2$ flowing through the transistor $Q_5$ becomes almost zero, hence, $I_2=0$. As described above, the direction of $I_3$ flowing through $R_4$ is reversed at a $V_{CC}$ where $V_{CC}=V_4$, and $I_2$ can be changed continuously with $V_{CC}$ so as to be larger than $I_B$ in a range where $V_{CC}>V_4$ and to be smaller than $I_B$ in a range where $V_{CC}<V_4$. If $V_{CC}$ is in the range of $V_3<V_{CC}<V_4$, $I_2$ is represented by $I_2=I_B-I_3$, hence, $I_2 \approx I_B-(V_1-V_2)/R_4$, while, if $V_{CC}$ is in the range of $V_4<V_{CC}<V_5$, $I_2$ is represented by $I_2=I_B+I_3$, hence, $I_2 \approx I_B+(V_2-V_1)/R_4$. Accordingly, the larger the resistance of the resistor $R_4$, the larger the current $I_2$ in the range of $V_3<V_{CC}<V_4$, while, the larger the resistance of the resistor $R_4$, the smaller the current $I_2$ in the range of $V_4<V_{CC}<V_5$. Thus, the slope of the $V_{CC}-I_2$ characteristic curve shown in FIG. 3 decreases with respect to the increase in $R_4$. Such change in the $V_{CC}-I_2$ characteristic curve by the resistance of the resistor $R_4$ is shown in FIG. 4. Accordingly, $I_2$ can continuously be changed with the change of $V_{CC}$, if the resistor $R_4$ is selected to have a large enough resistance. This feature enables the oscillating circuit of FIG. 2 to be a variable frequency oscillator.

There is a disclosure in Japanese patent application publication by Tokukaisho 63-193618 for driving a loudspeaker, wherein a differential amplifier is used for controlling the current supplied to the loudspeaker and a drive circuit therefor so that the current is decreased along with the reduction of the power voltage. However, the differential amplifier is not provided with a resistor like $R_4$ as described above and the concept of changing the slope of $V_{CC}-I_2$ characteristic curve by $R_4$ as in the present invention is not suggested.

The operation of the oscillating circuit of FIG. 2 with the change of the power source voltage $V_{cc}$ is described in the following.

Figure 5:
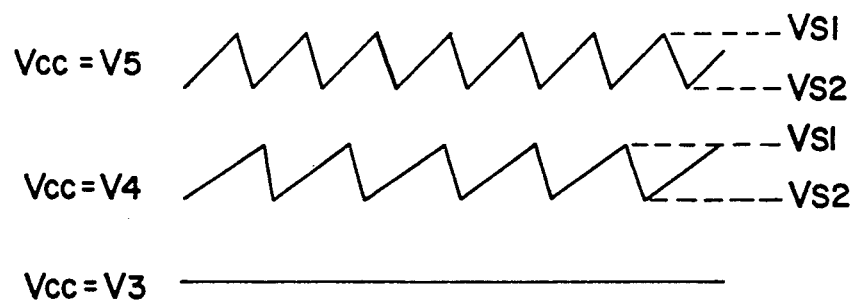
FIG. 5 shows waveforms of the signal output from the oscillating circuit of FIG. 2, corresponding to different $V_{cc}$s in the constant current circuit of FIG. 1.
Figure 6:
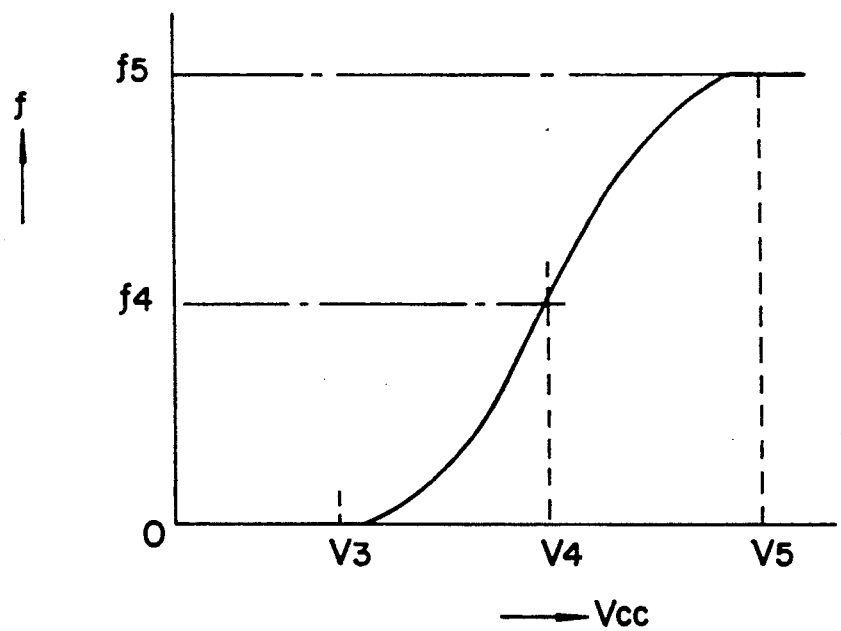
FIG. 6 is a graph showing the relation between power voltage $V_{cc}$ in the constant current circuit of FIG. 1 and oscillation frequency f of the circuit of FIG. 2.

The current $I_4$ to charge the capacitor $C_0$ of the oscillating circuit is equal to $I_2$ flowing through the transistor $Q_4$ in the constant current circuit of FIG. 1, due to the function of the current mirror comprising the transistors $Q_4$ and $Q_6$. Hence, the rate of charging the capacitor $C_0$ depends on the current $I_2$ which can be controlled by changing the power source voltage $V_{cc}$. On the other hand, the rate of discharging the capacitor $C_0$ is constant regardless of the change of $V_{cc}$. Therefore, the frequency of oscillating circuit of FIG. 2 changes according to the change of the power source voltage $V_{cc}$. FIG. 5 shows exemplary waveforms of the signal output from the oscillating circuit of FIG. 2, corresponding to aforementioned specific $V_{cc}$s of $V_3$, $V_4$ and $V_5$, and FIG. 6 shows the change in the frequency f of the output signal with respect to the change of $V_{cc}$. In FIG. 5, $V_{s1}$ and $V_{s2}$ represent the maximum and minimum of the voltages $V_0$ at an end of the capacitor $C_0$, respectively, which are detected by the voltage detection circuit $D_1$ as described above with reference to FIG. 2. In other words, $V_{s1}$ is a voltage $V_0$ where discharging of the capacitor $C_0$ initiates, and, $V_{s2}$ is a voltage $V_0$ where the charging of the capacitor $C_0$ initiates. As shown in FIG. 5, the rise time of the output signal decreases as $V_{cc}$ increases, while the fall time of the signal is constant because it only depends on the resistance inherent in the switching means SW shown in FIG. 2. At a power source voltage where $V_{cc}=V_3$, the frequency of the output signal is zero as shown in FIGS. 5 and 6, because the current $I_4$ becomes zero and the capacitor $C_0$ is not charged.

Figure 7:
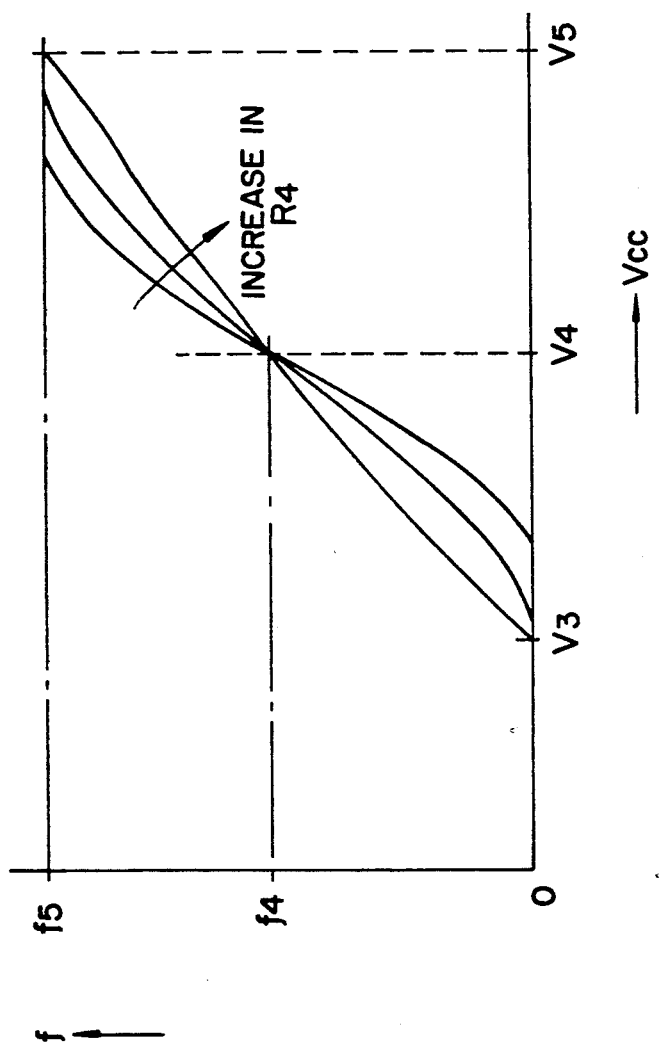
FIG. 7 is a graph showing the change of the slope of $V_{cc}-f$ characteristic curve of FIG. 6 with the change of $R_4$.

As mentioned before with reference to FIG. 4, the slope of $V_{cc}-I_2$ characteristic curve is decreased by increasing the resistance of the resistor $R_4$. Accordingly, the slope of $V_{cc}-f$ characteristic curve shown in FIG. 6 decreases with the increase of $R_4$ as shown in FIG. 7. Thus, it is possible to attain fine tuning of the oscillation frequency f by changing the power source voltage $V_{cc}$, and the circuit of FIG. 2 can be a variable frequency oscillator. It is obvious that if $R_4$ is decreased to zero, the slope of $V_{cc}-I_2$ characteristic curve of FIG. 4, and hence, the slope of $V_{cc}-f$ characteristic curve of FIG. 7 become so steep that the circuit of FIG. 2 could not be used as a variable frequency oscillator.

Figure 8:
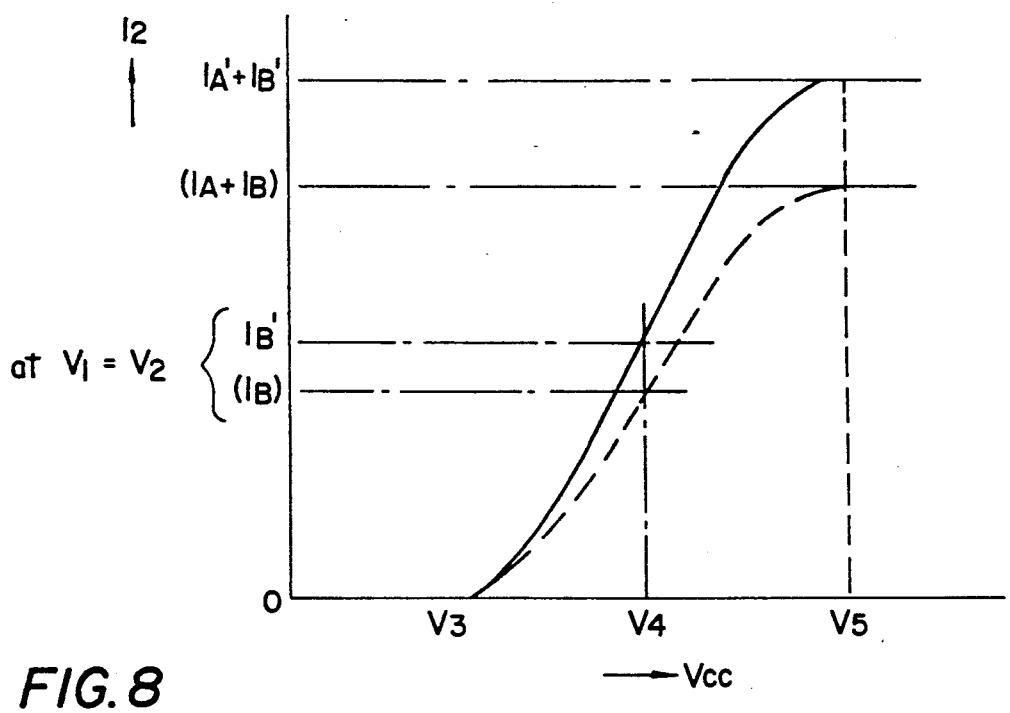
FIG. 8 is a graph for explaining an extended change of $I_2$ in the $V_{cc}-I_2$ characteristics of FIG. 3.
Figure 9:
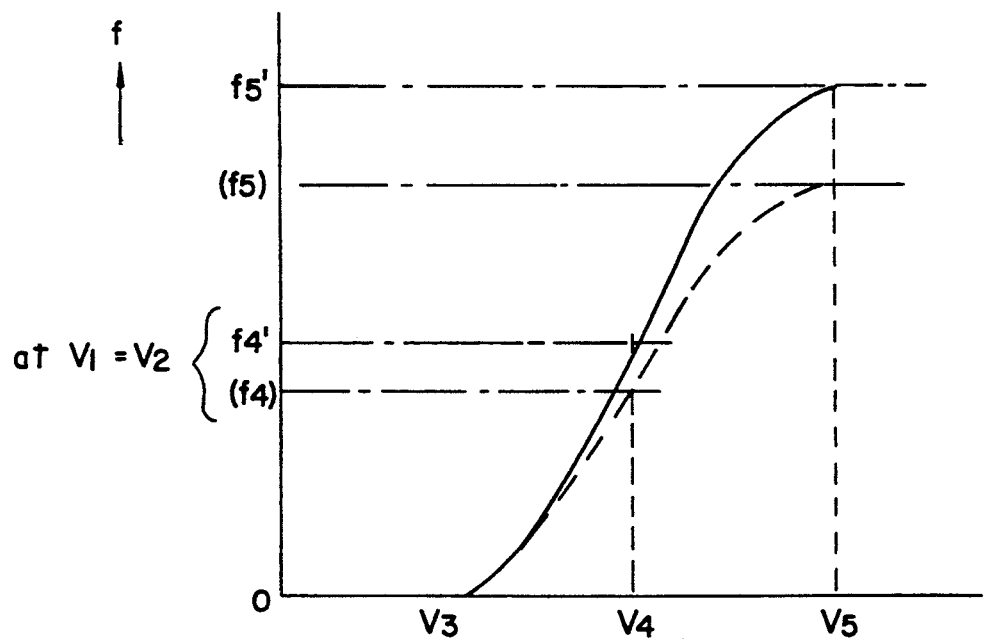
FIG. 9 is a graph for explaining an extended change of f in the $V_{cc}-f$ characteristics of FIG. 6.

Referring back to FIG. 1, if the constant current supplying sources $I_A$ and $I_B$ are replaced by corresponding ones having larger current capacities $I_A'$ and $I_B'$, respectively, the change of $I_2$ in the $V_{cc}-I_2$ characteristic curve of FIG. 3 is extended as shown in FIG. 8, hence, the change of f in the $V_{cc}-f$ characteristic curve of FIG. 6 is extended as shown in FIG. 9. In FIGS. 8 and 9, respective dotted lines represent original $V_{cc}-I_2$ characteristic curve corresponding to that in FIG. 3 and $V_{cc}-f$ characteristic curve corresponding to that in FIG. 6, and $f_4'$ and $f_5'$ respectively indicate the frequencies $f_4$ and $f_5$ changed according to the increase in $I_A$ and $I_B$.

Figure 10:
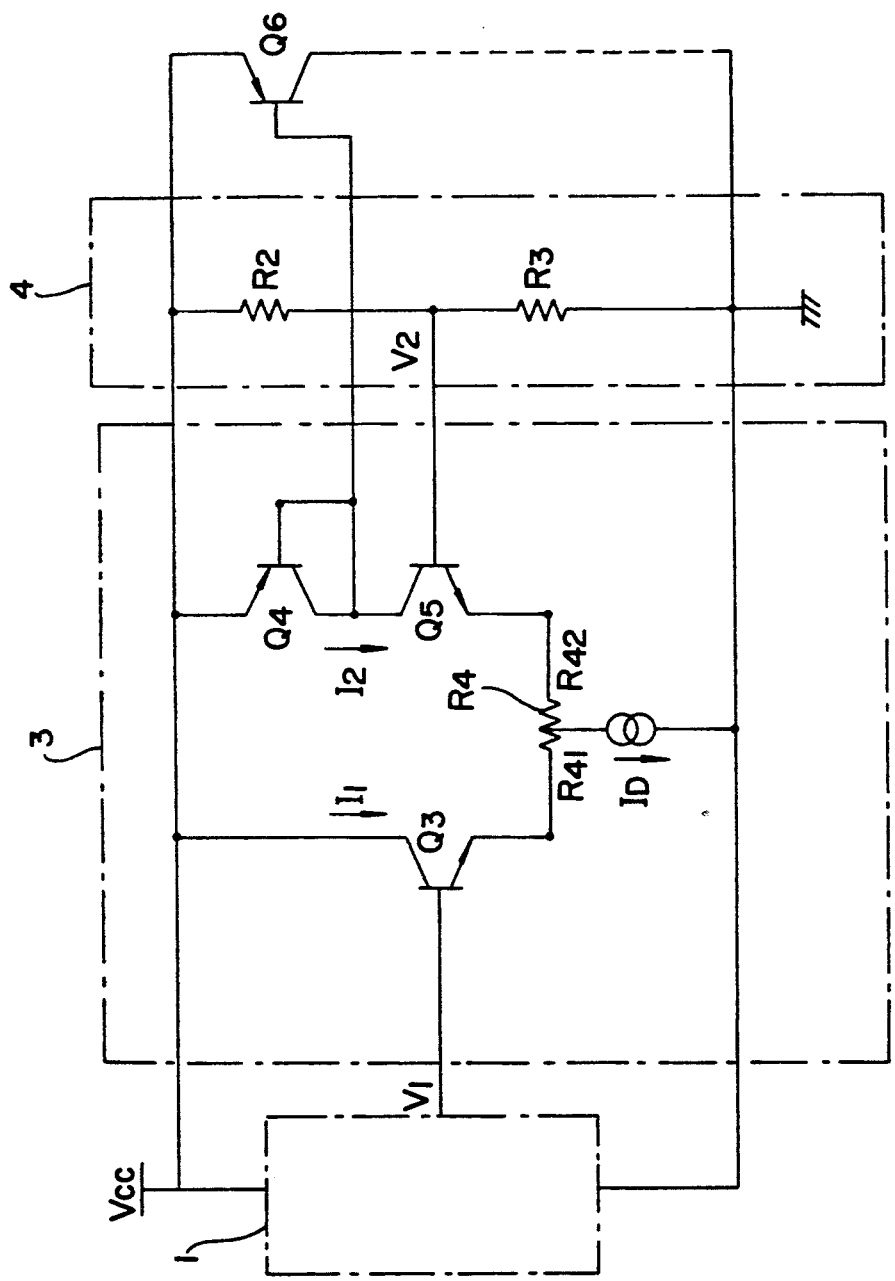
FIG. 10 is a diagram showing the fundamental configurations of another constant current circuit according to the present invention.

FIG. 10 is a diagram showing the fundamental configurations of another constant current circuit according to the present invention. The circuit comprising a reference voltage source 1, a differential amplifier block 3 and a voltage dividing block 4 for dividing power source voltage $V_{cc}$ is almost the same as the circuit of FIG. 1, except for that the FIG. 10 circuit includes only one constant current supplying source $I_D$ connected to a point on the resistor $R_4$, the point dividing $R_4$ into two parts $R_{41}$ and $R_{42}$. If $R_4$ is equally divided, i.e. $R_{41}=R_{42}$, the constant current circuit of FIG. 10 has the same characteristics as that of the circuit of FIG. 1. The feature of $R_4$ to change the slope of the $V_{cc}-I_2$ characteristics is also provided. When $R_4$ is not equally divided, i.e. $R_{41} \neq R_{42}$, the $V_{cc}-I_2$ characteristic curve regarding the circuit shifts along the $V_{cc}$ axis, wherein the direction and amount of the shift depends on the ratio $R_{41}/R_{42}$.

Figure 11:
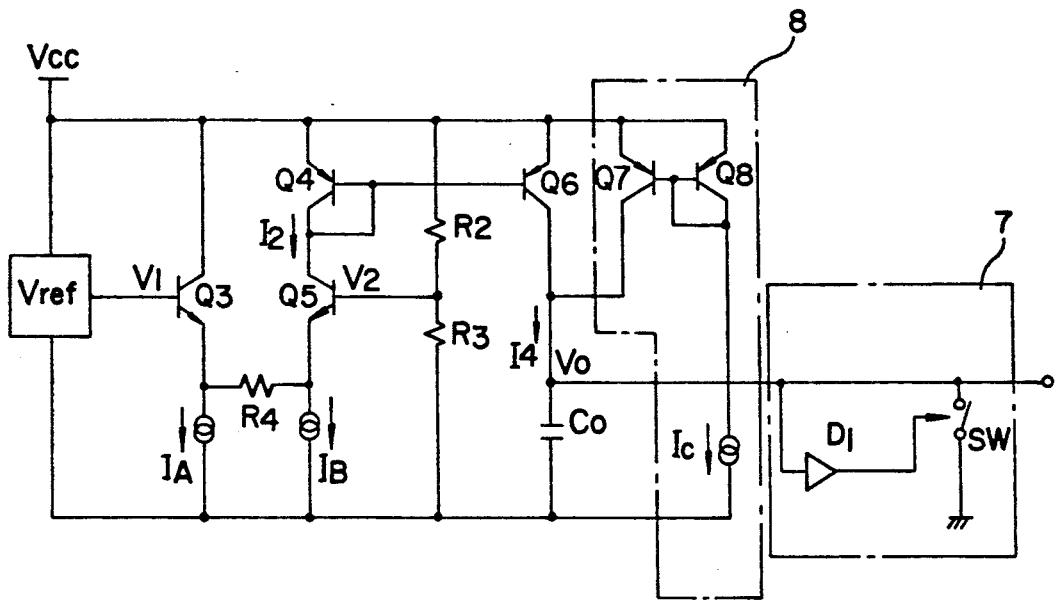
FIG. 11 is a diagram showing the first embodiment of the present invention.
Figure 12:
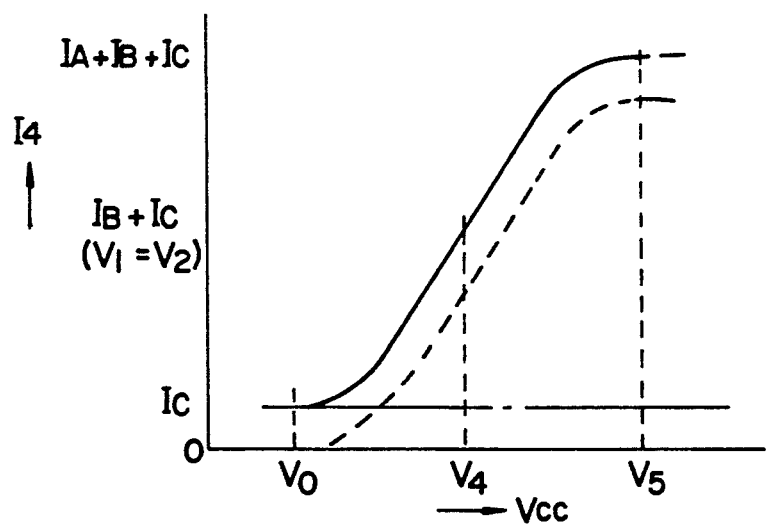
FIG. 12 is a graph for explaining the shift of $I_4$ in the circuit of FIG. 11.
Figure 13:
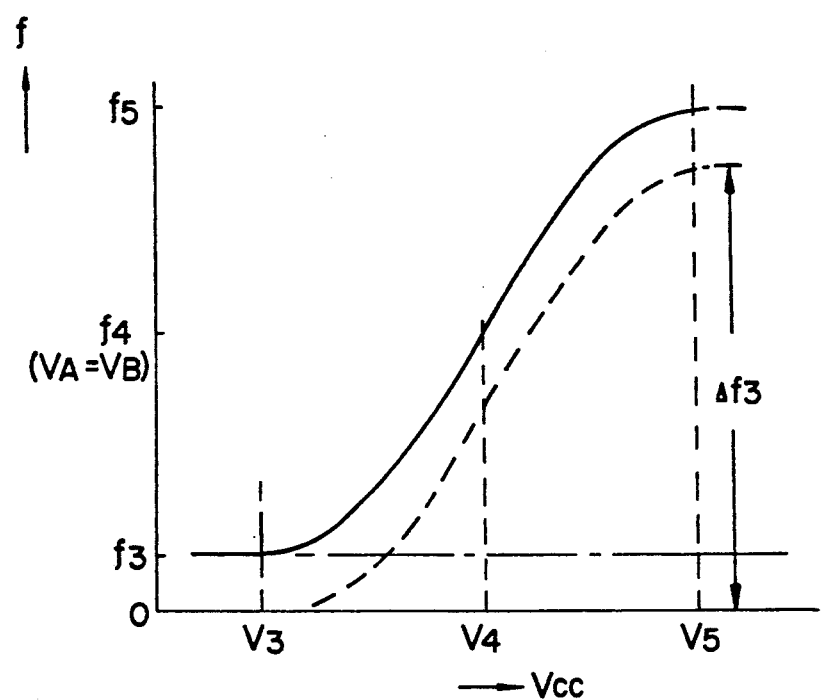
FIG. 13 is a graph for explaining the shift of frequency f in the circuit of FIG. 11.
Figure 14:
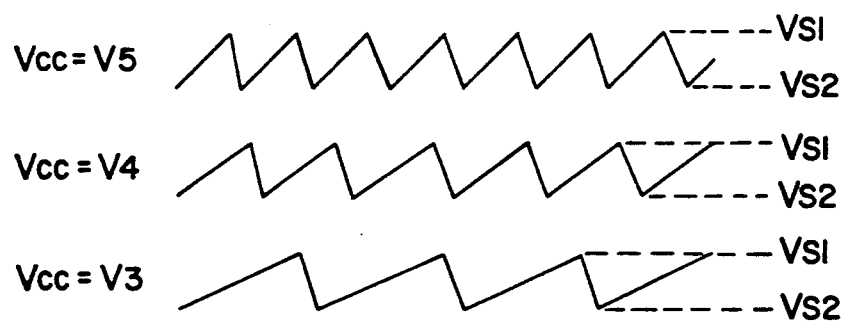
FIG. 14 shows waveforms of the signal output from the circuit of FIG. 11, corresponding to different $V_{cc}$S.

The first embodiment of the present invention is shown in FIG. 11, comprising a constant current circuit and an oscillating circuit which have configurations respectively based on those of FIGS. 1 and 2. This embodiment circuit is provided with an additional constant current supplying block 8 including a current mirror comprising transistors $Q_7$ and $Q_8$, both being bipolar transistors, for example, and a constant current supplying source $I_c$ connected to the collector of the transistor $Q_8$. The current $I_4$ for charging the capacitor $C_0$ is increased by the current $I_c$ such as represented by $I_4 \approx I_2 + I_c$. Thus, the current $I_4$ shifts larger by $I_c$ as shown in FIG. 12, wherein the dotted line represents the original $V_{cc}-I_4$ characteristic curve corresponding to that in FIG. 3. As a result of the shift, $I_4$ is not zero but $I_c$ at $V_{cc}=V_3$, different from $V_{cc}-I_2$ characteristic curve corresponding to that of the circuit shown in FIG. 1, in which $I_2$ is equal to $I_4$, hence, $I_4$ is zero at $V_{cc}=V_3$. Accordingly, the range of the oscillation frequency of the FIG. 11 circuit shifts higher by $\Delta f$ as shown in FIG. 13, wherein the frequency f is not zero but $f_3$ at $V_{cc}=V_3$. In FIG. 13, the dotted line represents the original $V_{cc}-f$ characteristic curve corresponding to FIG. 6. Waveforms of the signal output from the circuit of FIG. 11 are shown in FIG. 14, corresponding to the specific $V_{cc}s$ of $V_3$, $V_4$ and $V_5$.

Figure 15:
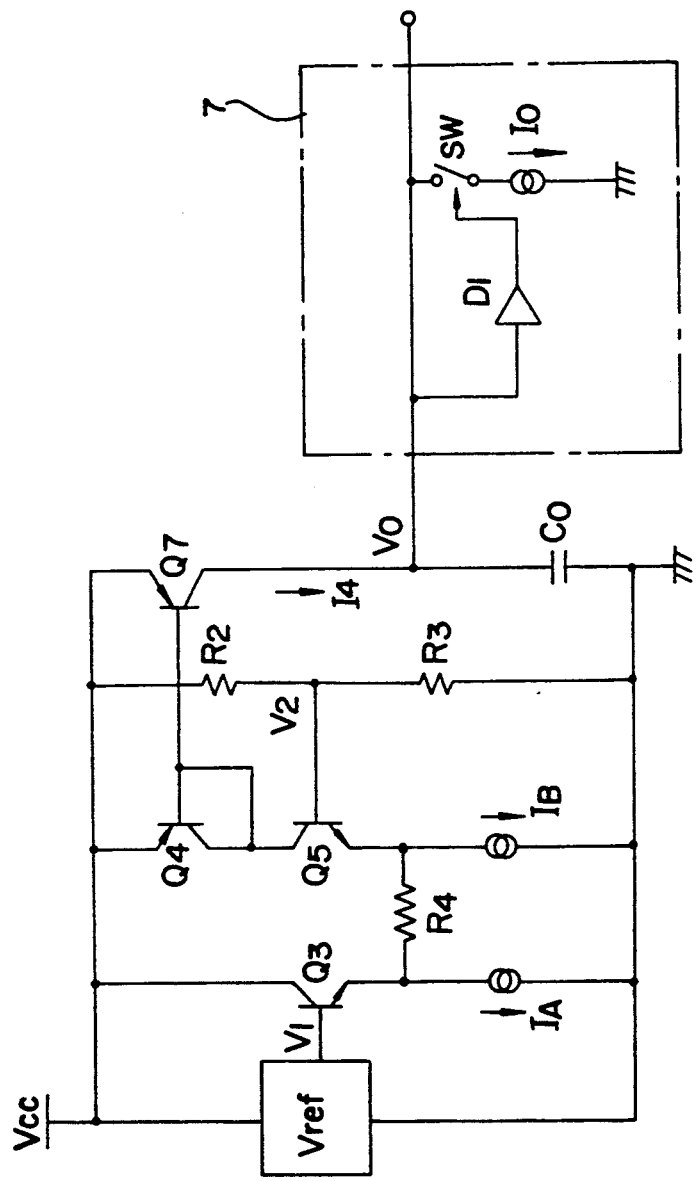
FIG. 15 is a diagram showing the second embodiment of the present invention.

The second embodiment of the present invention is shown in FIG. 15, comprising a constant current circuit and an oscillating circuit which have configurations respectively based on those of FIGS. 1 and 2. This embodiment circuit has an additional constant current supplying source $I_0$ connected in series to the switching means SW in the charge-discharge control block 7. With the addition of the constant current supplying source $I_0$, the current flowing through the switching means SW during discharging the capacitor $C_0$ is increased or decreased.

Figures 16, 17:
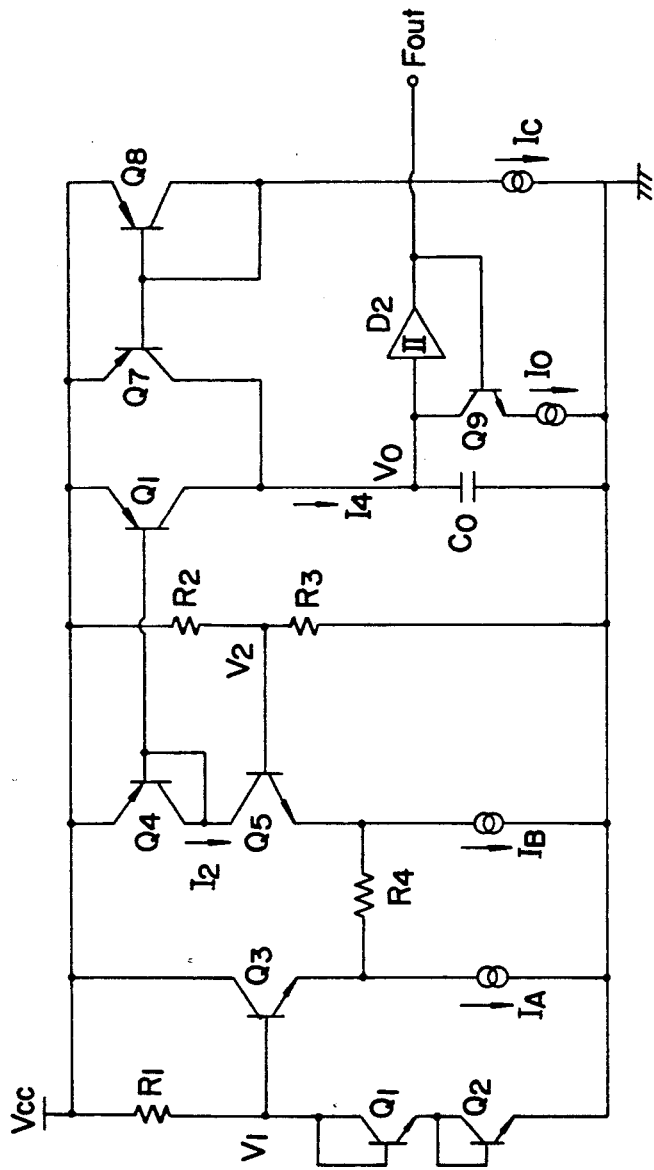
FIG. 16 shows waveforms of the signal output from the circuit of FIG. 15, corresponding to different $V_{cc}$S.
FIG. 17 is a diagram showing a third embodiment of the present invention.

If the current $I_0$ is selected as $I_0 = nI_4$, the ratio of the time for discharging to the time for charging of the capacitor $C_0$ is represented by $1/(n-1)$, wherein n represents a positive number larger than 1. Thus, the rise time to fall time ratio of the signal output from the circuit of FIG. 15 can be controlled, depending on the current capacity of the constant current supplying source $I_0$. Waveforms of the signal output from the circuit of FIG. 15 in which the constant current supplying source $I_0$ has a current capacity of $I_0 = 2 I_4$ are shown in FIG. 16, corresponding to the specific $V_{cc}s$ of $V_3$, $V_4$ and $V_5$. As seen in FIG. 16, the duty factor of each waveform is 50%.

Figure 19:
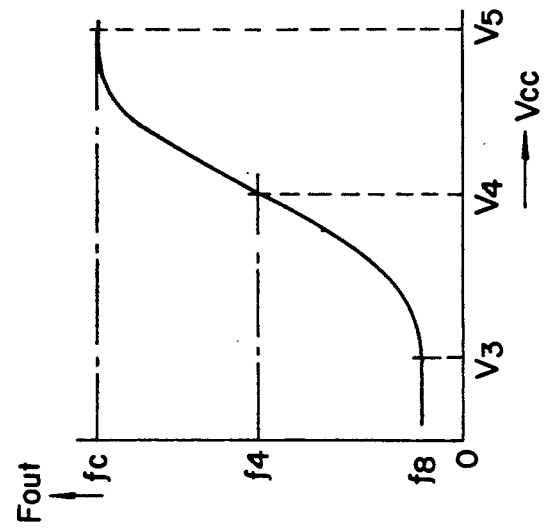
FIG. 19 is a graph showing the $V_{cc}-f$ characteristics of the circuit of FIG. 17.
Figure 18:
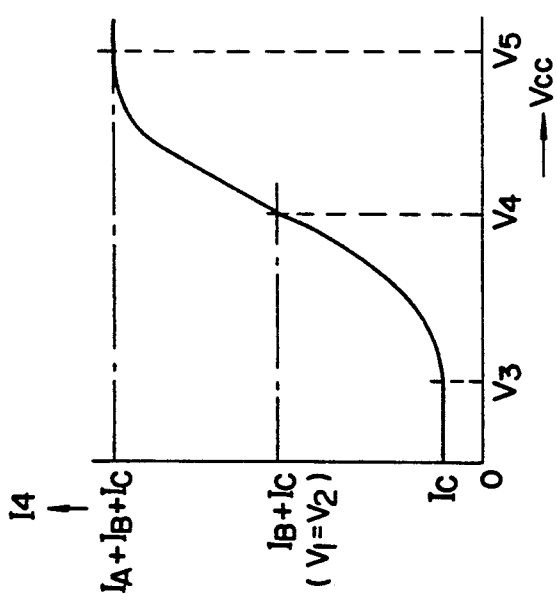
FIG. 18 is a graph showing the $V_{cc}-I_4$ characteristics of the circuit of FIG. 17.

The third embodiment of the present invention is shown in FIG. 17, comprising a constant current circuit and an oscillating circuit which have configurations respectively based on those of FIGS. 1 and 2. This embodiment circuit includes constant current supplying sources $I_c$ and $I_0$ introduced by the precedent embodiments described respectively with reference to FIGS. 11 and 15. In the circuit of FIG. 17, the transistors $Q_1$ and $Q_2$, both bipolar transistors, for example, and a resistor $R_1$ constitute a source of reference voltage $V_1$. The base-emitter junction voltage of the transistors $Q_1$ and $Q_2$ which are connected each other in series and supplied with a bias current is used as a constant voltage source. In FIG. 17, a transistor $Q_9$ is used as a switching means and a Schmitt circuit $D_2$ is used as a voltage detection circuit, respectively corresponding to those denoted by reference symbols SW and $D_1$ in FIGS. 11 and 15. The Schmitt circuit $D_2$ converts triangular pulse signals into rectangular pulse signals thanks to the waveform shaping function thereof based on the inherent hysteresis characteristics between the input and output. The $V_{cc}-I_4$ characteristics and the $V_{cc}-f$ characteristics of the circuit of FIG. 17 are as shown in FIGS. 18 and 19, respectively.

Figure 20:
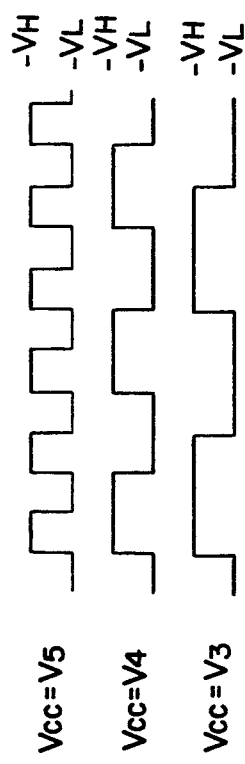
FIG. 20 shows waveforms of the signal output from the circuit of FIG. 17, corresponding to different $V_{cc}$S.

In the circuit of FIG. 17, the Schmitt circuit $D_2$ has two threshold values of a high level $S_H$ and a low level $S_L$, and jumps the output $F_{out}$ thereof to high level $V_H$, if $V_0$ increase up to the high level threshold $S_H$. Hence, the transistor $Q_9$ turns on and the capacitor $C_0$ is discharged. Accordingly, the voltage $V_0$ decreases but the output remains at high level $V_H$. When the voltage $V_0$ reaches the low level threshold $S_L$, the Schmitt circuit $D_2$ jumps the output $F_{out}$ to low level $V_L$. As a result, the transistor $Q_9$ turns off and the capacitor $C_0$ is stopped from discharging and begins to be charged by the current $I_4$. Hence, the voltage $V_0$ increases but the output remains at low level $V_L$ until the voltage $V_0$ reaches the high level threshold $S_H$. Waveforms of the signal output from the circuit of FIG. 17 are shown in FIG. 20, corresponding to the specific power source voltages $V_{cc}$ of $V_3$, $V_4$ and $V_5$. The waveforms are obtained when the constant current supplying source $I_0$ having a current capacity of $I_0 = 2 I_4$ is used, and, the rectangular pulses have a duty factor of 50%.

Any of the above embodiment circuits can be incorporated in a monolithic integrated circuit, therefore, they are suitably applied to computers like notebook-sized personal computers powered by batteries, hence, resulting in power savings of the computers by lowering the clock signal frequency and the power voltage during operations such as mode selection. The feature of variable frequency clock signals with the use of a single oscillating circuit, attained by the present invention also results in the reduction of hardware and production cost, while improving the reliability of the computers.

What is claimed is:
1. A constant current circuit comprising:
a source for supplying power voltage;
two constant current supplying sources;
a first transistor having a gate means and connected between said power voltage supplying source and one said constant current supplying source, said gate means being provided with a reference voltage;

a voltage divider providing a divided voltage of said power voltage;

a second transistor having a gate means and connected between said power voltage supplying source and another said constant current supplying source, said gate means being provided with the divided voltage;

a resistor connected between respective nodes of said first transistor and second transistor and said constant current supplying sources;

whereby the current flowing through said second transistor is controlled according to the magnitude of said power voltage and the rate of change of the current with respect to the change of the power voltage depends on the resistance of said resistor.

2. A constant current circuit comprising:

a source for supplying power voltage;

first and second resistors each having a predetermined resistance and connected in series whereby providing an end for each and a common node;

a constant current supplying source connected to the node of said resistors;

a first transistor having a gate means and connected between said power voltage supplying source and said end of said first resistor, said gate means being provided with a reference voltage;

a voltage divider providing a divided voltage of said power voltage;

a second transistor having a gate means and connected between said power voltage supplying source and said end of said second resistor, said gate means being provided with the divided voltage;

wherein the current flowing through said second transistor is controlled according to the magnitude of said power voltage and the rate of change of the current with respect to the change of the power voltage depends on the total resistance of said resistors.

3. An oscillating circuit which is controlled by the constant current circuit as set forth in claim 1 or 2, further comprising:

a capacitor;

a charging circuit coupled with the constant current circuit for charging said capacitor with a current which is equivalent to the current flowing through said second transistor in the constant current circuit;

switching means connected in parallel with said capacitor;

detection means detecting the voltage across said capacitor and instructing said switching means to be open if the voltage reaches a lower predetermined voltage and to be closed if the voltage reaches a higher predetermined voltage.

4. A oscillating circuit as set forth in claim 3, further comprising:

an additional constant current supplying source coupled with said capacitor for providing said capacitor with an additional charging current independent from the current flowing through said second transistor in the constant current circuit, whereby the oscillation frequency range of said oscillating circuit is shifted to a higher frequency range by the additional constant current supplying source.

5. A oscillating circuit as set forth in claim 3, further comprising:

an additional constant current supplying source connected in series with said switching means, said additional constant current supplying source controlling the current flowing through said switching means, if it is closed, such that the current is n times as large as the current flowing through said second transistor in the constant current supplying source, wherein n is a positive number larger than 1, whereby the duty factor of pulses output from the oscillating circuit outputs can be changed.

* * * * *